United States Patent
Sakiyama et al.

(10) Patent No.: US 7,396,237 B2
(45) Date of Patent: Jul. 8, 2008

(54) ELECTRONIC CIRCUIT MODULE AND SURFACE-MOUNTED CONNECTOR FOR USE IN THE SAME

(75) Inventors: Tomoyuki Sakiyama, Kyoto (JP); Masato Kuwahara, Kyoto (JP); Hitoshi Nakai, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 0 days.

(21) Appl. No.: 11/585,181

(22) Filed: Oct. 24, 2006

(65) Prior Publication Data
US 2007/0149010 A1 Jun. 28, 2007

(30) Foreign Application Priority Data
Dec. 26, 2005 (JP) .............................. 2005-371909

(51) Int. Cl.
*H01R 12/00* (2006.01)
(52) U.S. Cl. ....................................................... 439/79
(58) Field of Classification Search .................. 439/79, 439/80, 81
See application file for complete search history.

(56) References Cited

U.S. PATENT DOCUMENTS

| 4,717,218 A | * | 1/1988 | Ratcliff | 439/59 |
| 5,944,536 A | * | 8/1999 | Seong et al. | 439/79 |
| 5,989,040 A | * | 11/1999 | Nishimatsu | 439/79 |
| 5,993,224 A | * | 11/1999 | Quillet et al. | 439/79 |
| 6,293,818 B1 | * | 9/2001 | Kim et al. | 439/495 |
| 6,341,988 B1 | * | 1/2002 | Zhu et al. | 439/630 |
| 6,629,851 B1 | * | 10/2003 | Kikuchi et al. | 439/79 |
| 6,736,649 B1 | * | 5/2004 | Fahllund | 439/79 |
| 6,997,752 B2 | * | 2/2006 | Kato et al. | 439/637 |
| 7,182,610 B2 | * | 2/2007 | Lin | 439/79 |
| 2006/0234530 A1 | * | 10/2006 | Chung | 439/79 |

FOREIGN PATENT DOCUMENTS

| JP | 2000-294321 | 10/2000 |
| JP | 2002-42925 | 2/2002 |
| JP | 2002-352883 | 12/2002 |
| JP | 2005-129417 | 5/2005 |

* cited by examiner

*Primary Examiner*—Phuong K Dinh
(74) *Attorney, Agent, or Firm*—Nixon & Vanderhye P.C.

(57) ABSTRACT

A first recessed portion shaped so as to be open toward an outer periphery of a substrate is disposed on the substrate, and a conductive pattern is provided on an edge portion of the first recessed portion. A connector mounted on the substrate includes a body and terminals which are surface-mounted on the substrate and protrude from the body. The connector is mounted on the substrate such that a bottom of the terminals is positioned higher than a bottom of the body by a predetermined height. The connector is mounted on the substrate such that the body is disposed in the first recessed portion and the terminals contact the conductive pattern on the substrate.

19 Claims, 8 Drawing Sheets

Fig. 2A
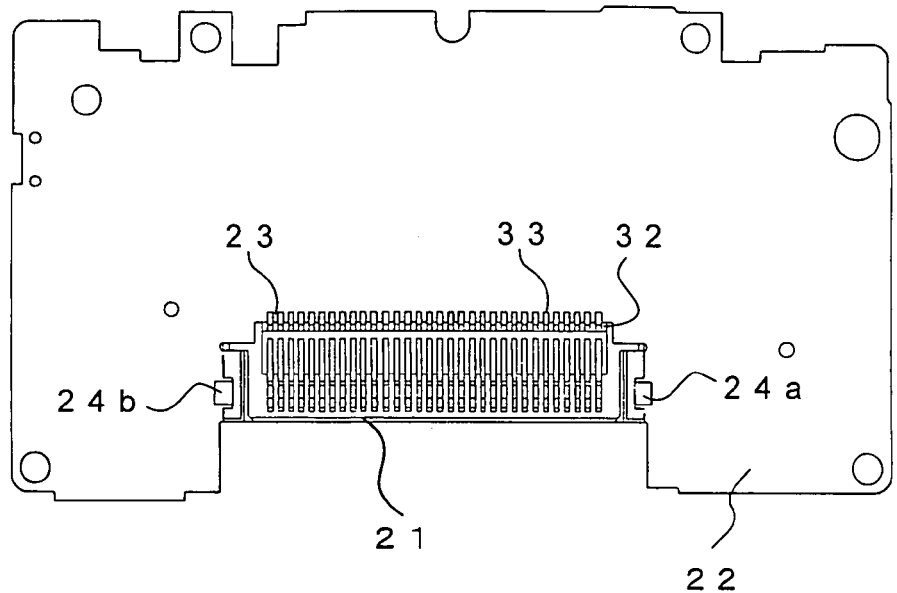
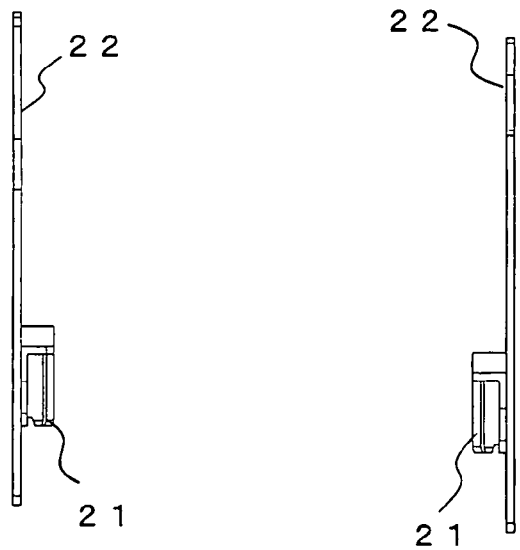
Fig. 2B          Fig. 2D
Fig. 2C
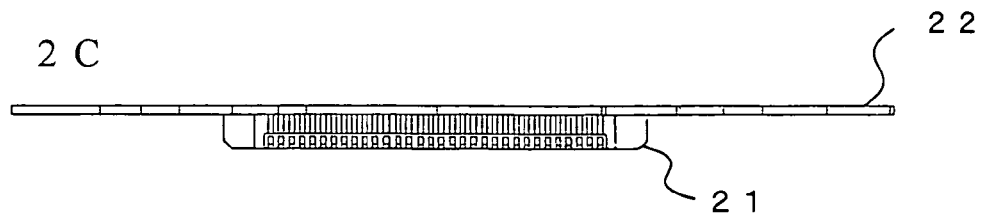

Fig. 4E
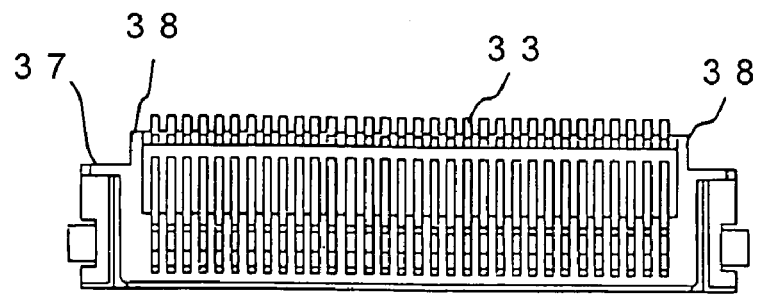
Fig. 4F
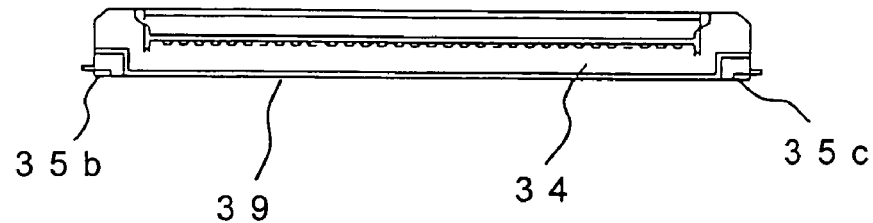
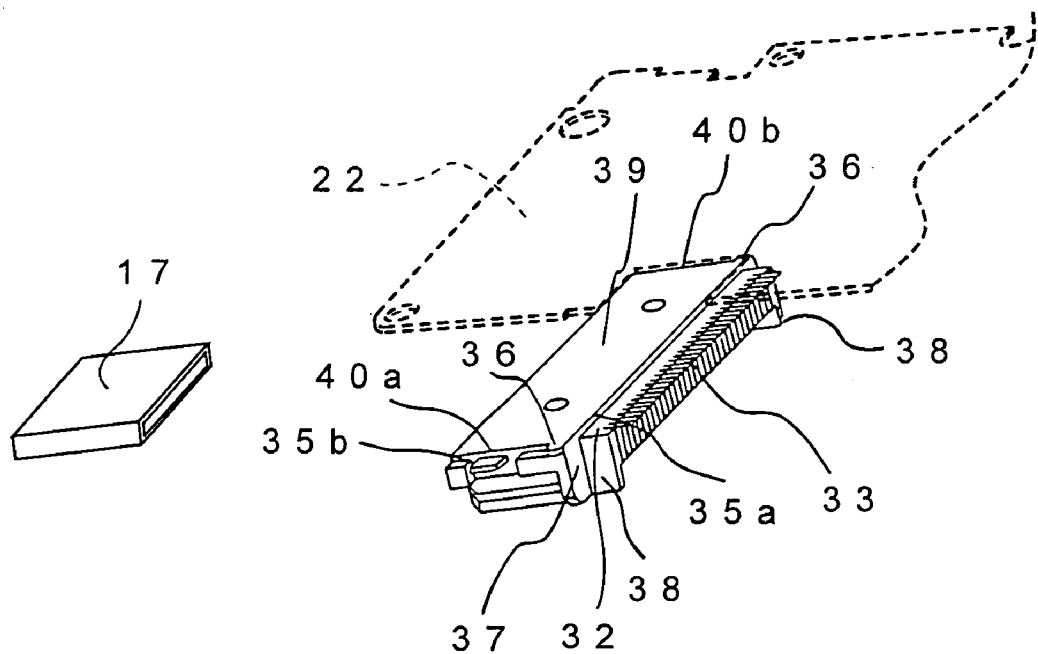
Fig. 4G

Fig. 5A
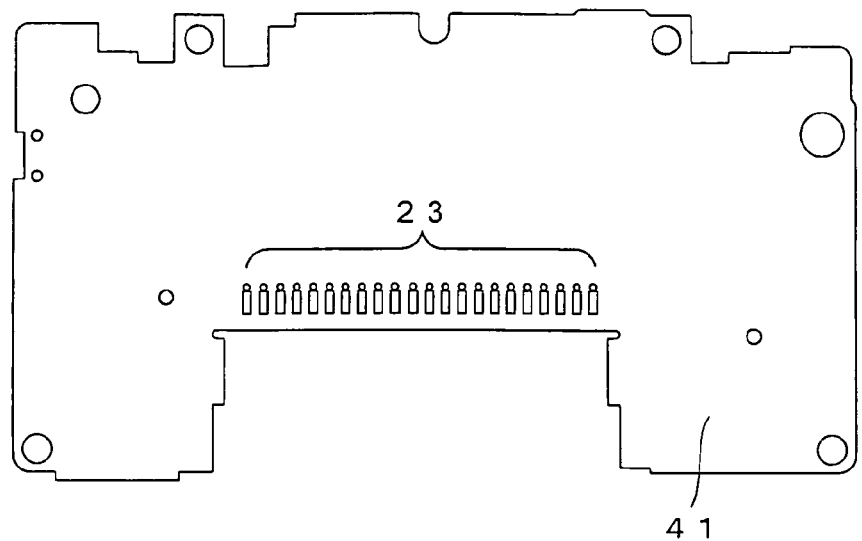
Fig. 5B
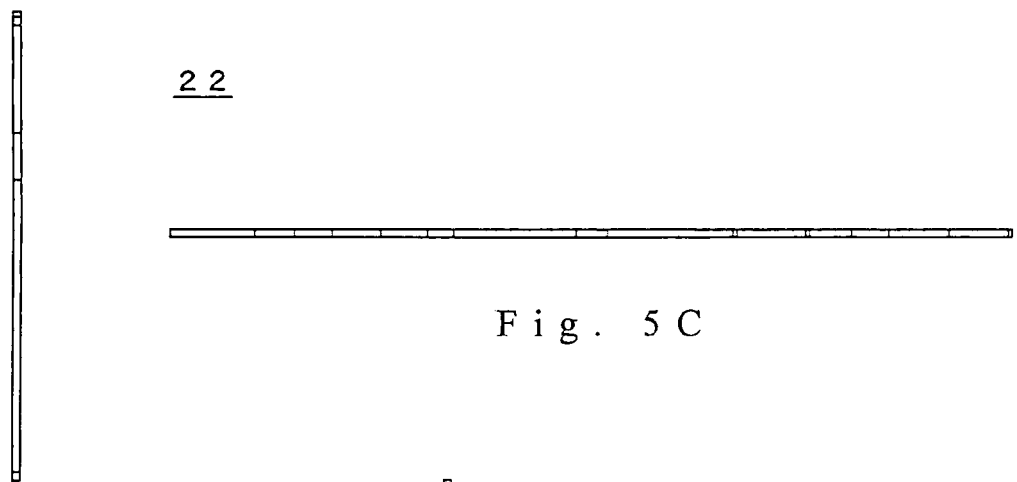
Fig. 5C
Fig. 5D

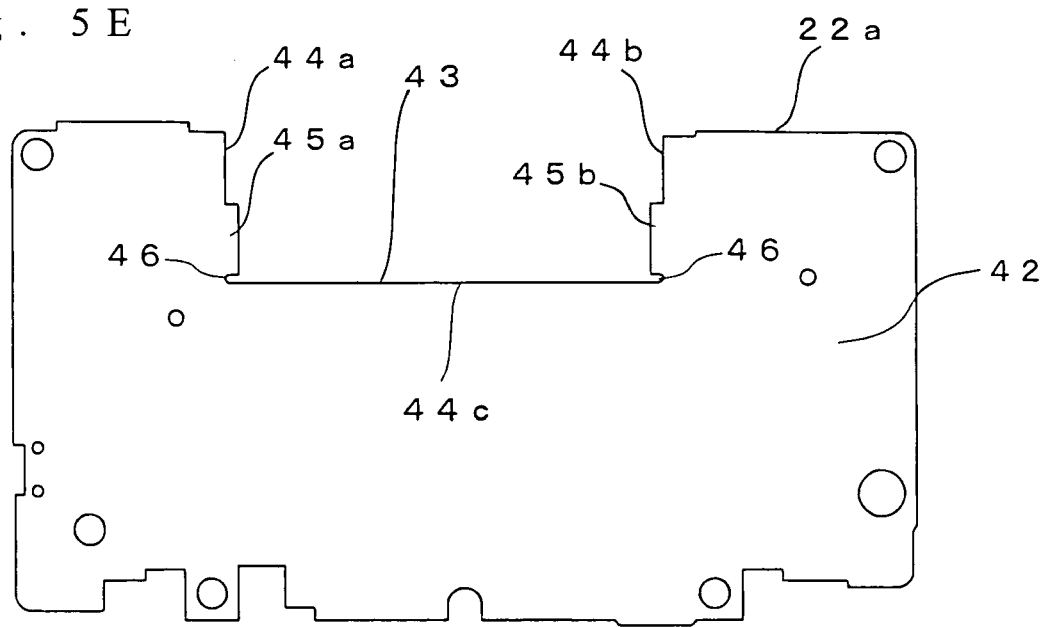

ELECTRONIC CIRCUIT MODULE AND SURFACE-MOUNTED CONNECTOR FOR USE IN THE SAME

CROSS REFERENCE TO RELATED APPLICATION

The disclosure of Japanese Patent Application No. 2005-371909, filed on Dec. 26, 2005, is incorporated herein by reference.

BACKGROUND OF THE INVENTION

1. Field of the Invention

The present invention relates to an electronic circuit module, and more particularly to an electronic circuit module in which a connector is surface-mounted on a thin substrate.

2. Description of the Background Art

As a method for forming a printed circuit board for use in an electronic device by mounting semiconductor chip components on a substrate in such a manner as to reduce a weight and a size of the electronic device, a surface mount technology is well-known. When the printed circuit board is formed by using the surface mount technology, circuit components are connected only to a surface of a substrate so as to eliminate through-holes. Therefore, a wiring can be arranged with enhanced flexibility, thereby downsizing the components and increasing packing density (for example, refer to Japanese Laid-Open Patent Publication No. 2005-129417).

However, in the method disclosed in Japanese Laid-Open Patent Publication No. 2005-129417, a connector is mounted on the substrate, so that a thickness of the connector is entirely added to a thickness of a circuit. However, such a space for the connector cannot be allowed in order to reduce a size and a thickness of the electronic device.

SUMMARY OF THE INVENTION

Therefore, an object of the present invention is to provide an electronic circuit module which is able to be incorporated into an electronic device so as to increase reduction in thickness of the electronic device.

The present invention has the following features to attain the object mentioned above. The reference numerals, supplementary descriptions and the like in the parentheses indicate the correspondence with the embodiment described below in order to aid in understanding the present invention and are not intended to limit, in any way, the scope of the present invention.

A first aspect of the present invention is directed to an electronic circuit module comprising a substrate (22) and a connector (21) which is at least surface-mounted on the substrate. The substrate includes a first recessed portion (43) shaped so as to be open toward an outer periphery of the substrate, and a conductive pattern on an edge portion of the first recessed portion. The connector includes a body (31), and terminals (33) which are surface-mounted on the substrate and protrude from the body. The connector is mounted on the substrate such that a bottom of the terminals is positioned higher than a bottom (39) of the body by a predetermined height. Further, the connector is mounted on the substrate such that the body is disposed in the first recessed portion and the terminals contact the conductive pattern on the substrate.

In a second aspect based on the first aspect, the connector is mounted on the substrate such that a stepped portion (35a) provided between the bottom of the body and the bottom of the terminals engages with a side surface of the substrate at the first recessed portion.

In a third aspect based on the first aspect, the body includes a protrusion portion (32), and the connector is mounted on the substrate such that a bottom of the protrusion portion is positioned higher than the bottom of the body by the predetermined height. Further, the connector is mounted on the substrate such that the protrusion portion engages with the substrate.

In a fourth aspect based on the third aspect, the protrusion portion protrudes from the body and has the terminals mounted thereon. Further, the terminals protrude from the protrusion portion.

In a fifth aspect based on the fourth aspect, an outer periphery of the first recessed portion of the substrate is defined by three sides (44a, 44b, 44c). Further, the conductive pattern is provided near an edge portion of a center side among the three sides. Furthermore, the protrusion portion engages with the substrate at a position near the center side when the connector is mounted on the substrate.

In a sixth aspect based on the fourth aspect, the body has reinforcing portions (38) extending from both sides of the protrusion portion in a direction in which the terminals protrude from the protrusion portion.

In a seventh aspect based on the sixth aspect, the reinforcing portions are disposed to a right and a left of the terminals.

In an eighth aspect based on the fifth aspect, the body further includes auxiliary protrusion portions. Further, the connector is mounted on the substrate such that the auxiliary protrusion portions engage with the substrate near a right side and a left side among the three sides, respectively, and bottoms of the auxiliary protrusion portions are positioned higher than the bottom of the body by the predetermined height.

In a ninth aspect based on the first aspect, an outer periphery of the first recessed portion of the substrate is defined by three sides, and a center side among the three sides is longer than a right side and a left side among the three sides. Further, the conductive pattern is provided near an edge portion of the center side along almost an entire length of the center side. Furthermore, a surface, of the body, corresponding to the center side contacts the center side when the connector is mounted on the substrate, and the surface has a longitudinal length which is substantially equal to an entire length of the center side. Moreover, the terminals are provided at a position which corresponds to the conductive pattern when the connecter is mounted on the substrate.

In a tenth aspect based on the first aspect, the first recessed portion is formed by removing at least almost a half of one side of the substrate so as to receive the connector, and the first recessed portion engages with the connector so as to mount the connector on the substrate.

In an eleventh aspect based on the first aspect, the first recessed portion includes second recessed portions (46) so as to prevent the connector engaging with the first recessed portion from moving sideways. Further, the connector includes projections (36) shaped so as to correspond to the second recessed portions, and the projections are disposed at positions corresponding to the second recessed portions when the connector is mounted on the substrate.

In a twelfth aspect based on the eleventh aspect, an outer periphery of the first recessed portion of the substrate is defined by three sides. Further, the second recessed portions are formed on the right side and the left side among the three sides.

In a thirteenth aspect based on the first aspect, switch components (14) for allowing a user to operate the electronic circuit module are disposed to a right and a left of the connector mounted on the substrate.

In a fourteenth aspect based on the first aspect, the electronic circuit module is accommodated in a housing (18b) so as to be pressed against the housing.

In a fifteenth aspect based on the first aspect, the connector is a connector into which a cartridge for a game apparatus is inserted.

In a sixteenth aspect based on the first aspect, the predetermined height is determined such that a bottom of the substrate is flush with the bottom of the body when the connector is mounted on the substrate.

A seventeenth aspect of the present invention is directed to a connector (21) which is surface-mounted on a predetermined substrate (22). Further, the connector comprises a body (31), and terminals (33) which are surface-mounted on the predetermined substrate and protrude from the body. Furthermore, the connector is mounted on the predetermined substrate such that a bottom of the terminals is positioned higher than a bottom of the body by a predetermined height. The connector is mounted on the predetermined substrate such that the body is disposed in a recessed portion of the predetermined substrate and the terminals contact a conductive pattern on the predetermined substrate.

According to the first aspect, a thickness of the electronic circuit module obtained using the surface-mounting can be reduced as compared to a conventional art, thereby realizing a reduction in thickness of an electronic device incorporating the electronic circuit module.

According to the second aspect, the same effect as that of the first aspect can be obtained.

According to the third aspect, it is possible to prevent the connector from moving up and down. Therefore, it is possible to enhance a stability of the connector.

According to the fourth and fifth aspects, it is possible to prevent the substrate from being distorted or warped, thereby enhancing a strength of the substrate.

According to the sixth to seventh aspects, when the cartridge is mounted on or dismounted from the connector, it is possible to enhance the stability of the connector.

According to the eighth to the tenth aspects, the stability of the connector can be enhanced, and the connector acts as a reinforcing component for the substrate, thereby preventing the substrate from being distorted or warped.

According to the eleventh and the twelfth aspects, when the cartridge or the like is dismounted from the connector, it is possible to prevent the connector from being pulled by the cartridge or the like and being removed from the substrate with the cartridge or the like.

According to the thirteenth and the fourteenth aspects, the stability of the electronic circuit module can be enhanced in the housing, thereby preventing the substrate from being moved or distorted.

According to the fifteenth aspect, even when the game cartridge is often mounted on or dismounted from the connector, it is possible to prevent a reduction in strength of a connector portion, thereby preventing a damage of the connector portion in a game apparatus.

According to the sixteenth aspect, when the connector is accommodated in the housing, the space in the housing can be effectively used or the space can be reduced from the housing According to the seventeenth aspect, the same effect as that of the first aspect can be obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a six-view diagram illustrating the electronic circuit substrate 22 on which the cartridge connector 21 is not mounted.

DESCRIPTION OF THE PREFERRED EMBODIMENTS

Hereinafter, an embodiment of the present invention will be described with reference to the drawings. It is to be understood that the present invention is not limited to the present embodiment.

Figure 1:
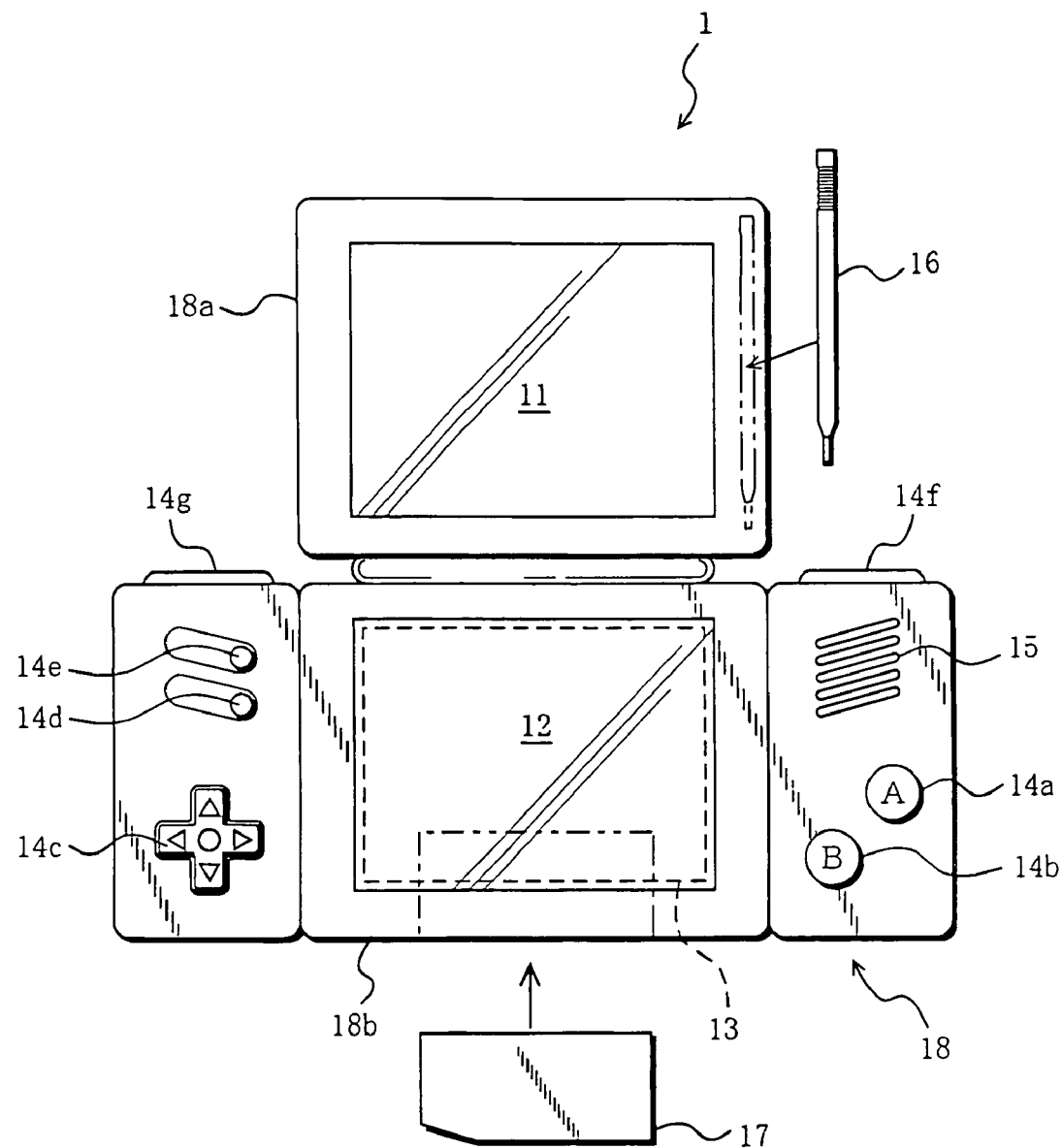
FIG. 1 is a diagram illustrating a hand-held game apparatus.

FIG. 1 is a view illustrating an outer appearance of a hand-held game apparatus 1 incorporating an electronic circuit module of the present embodiment. In FIG. 1, the hand-held game apparatus 1 of the present embodiment is accommodated in a housing 18 such that two liquid crystal displays, i.e., a first liquid crystal display (hereinafter, referred to as "an LCD") 11 and a second LCD 12 are placed in predetermined positions. Specifically, when the first LCD 11 and the second LCD 12 are to be disposed one on top of the other, the housing 18 is composed of an upper housing 18a and a lower housing 18b, and the upper housing 18a is supported by a portion of the upper side of the lower housing 18b so as to be pivotable. The upper housing 18a has a planar contour which is slightly larger than that of the first LCD 11, and has an opening in one principal surface thereof, through which a display screen of the first LCD 11 is exposed. The lower housing 18b has a more elongated planar contour than that of the upper housing 18a (i.e., so as to have a longer lateral dimension), and has an opening for exposing a display screen of the second LCD 12 formed in a portion of the lower housing 18b which lies substantially in the center of the lower housing 18b along the lateral direction. A sound hole 15 is formed on one of wings of the lower housing 18b between which the second LCD 12 is interposed. An operation switch section 14 is provided on the right and left wings of the lower housing 18b between which the second LCD 12 is interposed.

The operation switch section 14 includes: a direction switch 14c, a start switch 14d, and a select switch 14e, which are provided on a principal surface of the left wing of the lower housing 18b (lying to the left of the second LCD 12); and operation switches 14a and 14b, which are provided on a principal surface of the right wing of the lower housing 18b (lying to the right of the second LCD 12). The direction switch 14c is used by a player for providing instructions of moving directions for (i.e., a direction in which to move) a player object (or a player character) that can be controlled by the player, or instructions of a moving direction for a cursor, for example. The operation switches 14a and 14b are used for giving instructions other than instructions of moving directions. For example, the operation switches 14a and 14b are used for giving instructions such as: "jump", "punch", "use a weapon", etc., in the case of an action game or the like; or "get an item", "select a weapon", "select a command", etc., in the case of a role playing game (RPG) or a simulation RPG. As necessary, more operation switches may be added. For example, the operation switch section 14 may include side switches 14g and 14f provided on an upper surface (upper side surface) of the lower housing 18b.

Further, a touch panel 13 is mounted on the upper principal surface of the second LCD 12. The touch panel 13 may be of any one of, for example, a resistive film type, an optical type (infrared type), or a capacitive coupling type. When a stick 16 (or a finger) is pressed against or moved or dragged on the upper principal surface of the touch panel 13, the touch panel 13 detects for a coordinate position of the stick 16 and outputs coordinate data.

As necessary, a hole for accommodating the stick 16 with which to manipulate the touch panel 13 is provided near a side surface of the upper housing 18a. The hole can hold the stick 16. In a portion of a side surface of the lower housing 18b is provided a cartridge receptacle not shown, into which a game cartridge 17 internalizing a memory (e.g., a ROM) having a game program stored therein is detachably mounted. A cartridge connector 21 shown in FIG. 2 lies inside the cartridge receptacle for providing electrical connection with the game cartridge 17. Furthermore, the lower housing 18b and the upper housing 18a accommodates an electronic circuit substrate 22 shown in FIG. 2 on which various electronic components such as a CPU are mounted.

Figure 2E:
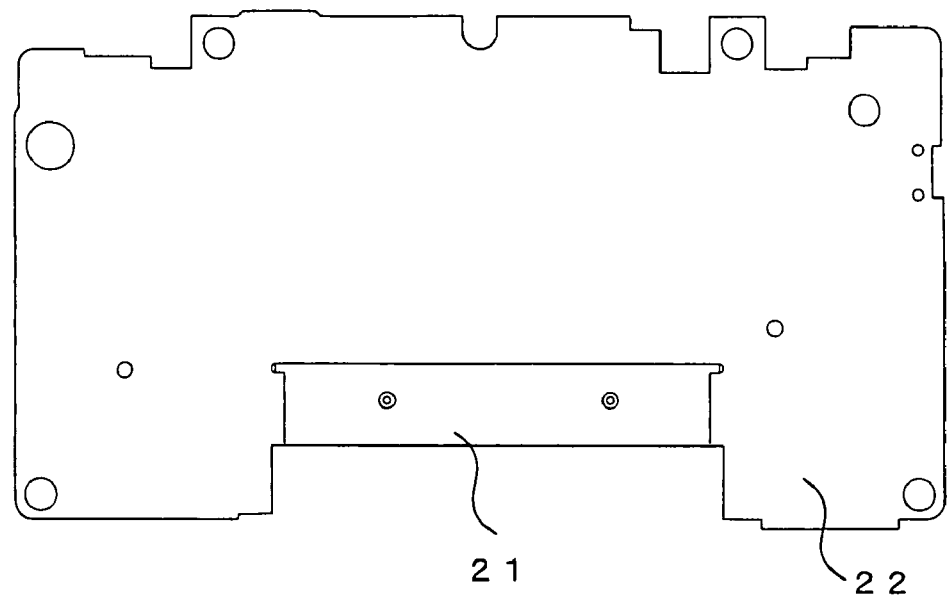
FIG. 2 is a six-view diagram illustrating an electronic circuit substrate 22 having a cartridge connector 21 mounted thereon.
Figure 2F:
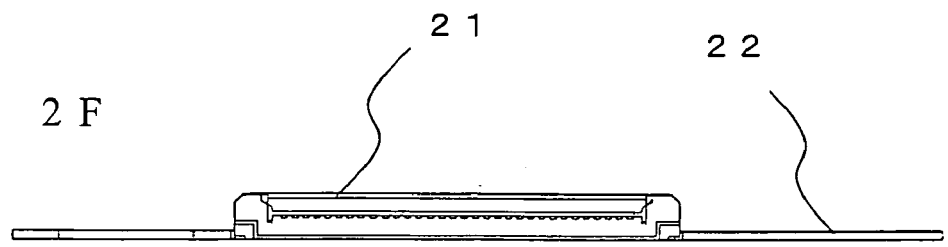
Figure 3A:
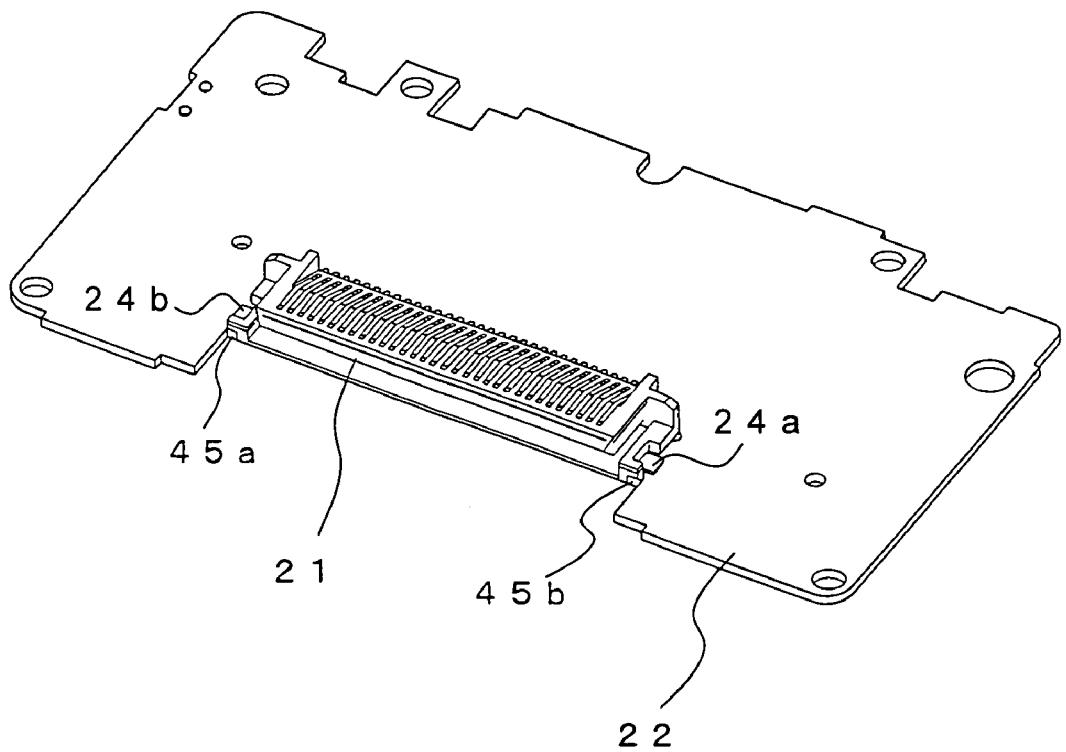
FIG. 3 is a perspective view illustrating the electronic circuit substrate 22 having the cartridge connector 21 mounted thereon.

FIG. 2 is a six view diagram illustrating the electronic circuit substrate (hereinafter, simply referred to as substrate) 22 accommodated in the lower housing 18b, and the cartridge connector (hereinafter, simply referred to as connector) 21 which is surface-mounted on the substrate 22. FIG. 2 (A) is a top view of the substrate 22 having the connector mounted thereon. Also shown are a plurality of terminals 33 extending from a protrusion 32 that contact a conductive pattern 23. Auxiliary protrusion portions 24a and 24b also serve to keep the connector in place and help prevent vertical movement. FIG. 2 (B) is a left side view thereof, FIG. 2 (C) is a front view thereof, FIG. 2 (D) is a right side view thereof, FIG. 2 (E) is a bottom view thereof, and FIG. 2 (F) is a rear view thereof. Further, FIGS. 3 (A) and 3 (B) are perspective views each illustrating the substrate 22 having the connector 21 mounted thereon. Hereinafter, the substrate 22 having the connector 21 mounted thereon is referred to as an electronic circuit module.

FIG. 4 is a six view diagram illustrating the connector 21 which is not mounted on the substrate 22. FIG. 4(A) is a top view of the connector 21, FIG. 4(B) is a left side view thereof, FIG. 4(C) is a front view thereof, FIG. 4(D) is a right side view thereof, FIG. 4(E) is a bottom view thereof, and FIG. 4(F) is a rear view thereof. FIG. 4(G) is a perspective view of the connector 21. In FIG. 4, the connector 21 includes a body 31, a protrusion portion 32, and a plurality of pin terminals 33. The body 31 includes an insertion section 34, stepped portions 35a, 35b, and 35c, and supporting portions 36.

Figure 4A:
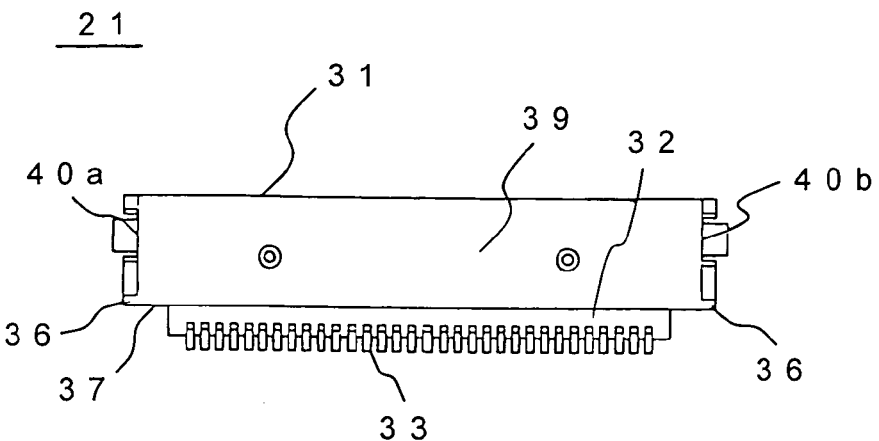
FIG. 4 is a six-view diagram illustrating the cartridge connector 21 which is not mounted on the electronic circuit substrate 22.

The protrusion portion 32 is positioned on the opposite side of the insertion section 34 along a long side 37 of the connector 21, and protrudes from the connector 21 toward the outside thereof as shown in FIGS. 4(A) and 4(E). Further, on both sides of the protrusion portion 32, reinforcing portions 38 are provided. The protrusion portion 32 is retreated from a top surface 39 of the connector 21 by a depth corresponding a thickness of the substrate 22.

The plurality of pin terminals 33 protrude from the protrusion portion 32 as shown in FIGS. 4(A) and 4 (E). Further, the plurality of pin terminals 33 are provided at positions corresponding to a conductive pattern disposed near an edge portion 44c of the substrate 22, which will be described below.

The insertion section 34 is an opening provided along the long side of the body 31 on the opposite side of the protrusion portion 32. The game cartridge 17 is detachably mounted to the insertion section 34 (see FIG. 4(F)).

Figure 4B:
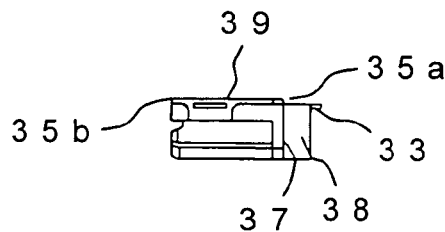
Figure 4C:
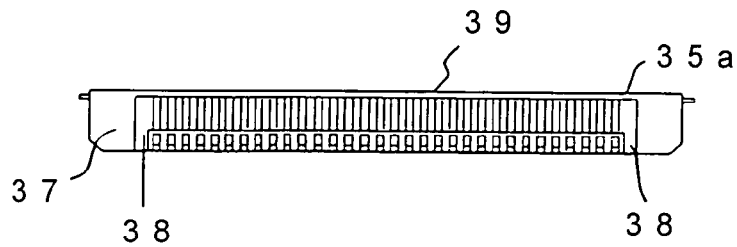
Figure 4D:
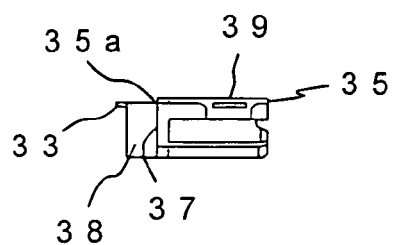

The stepped portion 35a is provided on the front side of the connector 21 along the long side 37 extending from the protrusion portion 32 toward the top surface 39 of the connector 21. That is, as shown in FIGS. 4(B), 4(D), and 4(G), the stepped portion 35a is a step-shaped portion including the protrusion portion 32 which is retreated from the top surface 39 in a depth direction, that is, in the downward direction as shown in FIGS. 4(B) and 4(D), by a dimension corresponding to a thickness of the substrate 22 described below. That is, the stepped portion 35a is formed by utilizing a height difference between the top surface 39 and the protrusion portion 32. Further, the plurality of pin terminals 33 protrude from the protrusion portion 32. The stepped portion 35b is provided on the left side of the connector 21 near the top surface 39 along a short side 40a of the connector 21. As shown in FIGS. 4(F) and 4(G), the stepped portion 35b is a step-shaped portion including a projection which is retreated from the top surface 39 in the depth direction, that is, in the downward direction, by the dimension corresponding to the thickness of the substrate 22 described below, as with the stepped portion 35a. The stepped portion 35c is provided on the right side of the connector 21, that is, on the opposite side of the stepped portion 35b, near the top surface 39 along a short side 40b of the connector 21. As with the stepped portion 35a, the stepped portion 35c is a step-shaped portion including a projection which is retreated from the top surface 39 in the depth direction, that is, in the downward direction, by the dimension corresponding to the thickness of the substrate 22.

The supporting portions 36 are projections provided on the top surface 39 at a position at which the long side 37 meets the short side 40a, and at a position at which the long side 37 meets the short side 40b. The supporting portions 36 are shaped so as to correspond to indentations 46 of the substrate 22 described below.

FIG. 4 (G) also shows a cutaway portion of the substrate 22 in communication with the connector 21. The protrusion portion 32 rests on a surface of the substrate as the substrate nestles into the stepped portion 35a. A cartridge 17 can be removably inserted into communication with the insertion section.

FIG. 5 is a six view diagram illustrating the substrate 22 which does not have the connector 21 mounted thereon. FIG. 5(A) is a top view of the substrate 22, FIG. 5(B) is a left side view thereof, FIG. 5(C) is a front view thereof, FIG. 5(D) is a right side view thereof, FIG. 5(E) is a bottom view thereof, and FIG. 5(F) is a rear view thereof. In FIG. 5, the substrate 22 includes a mounting surface 41, an unmounting surface 42, a cut portion 43, projections 45, and the indentations 46.

The mounting surface 41 includes a conductive pattern, and has mounted thereon circuit components (not shown), such as a semiconductor package and a resistor, other than the aforementioned connector 21. The mounting surface 41 includes the cut portion 43 and edge portions 44a, 44b, and 44c.

The unmounting surface 42 is a reverse side of the mounting surface 41. The unmounting surface 42 is flush with the top surface 39 of the connector 21 when the connector 21 is mounted on the substrate 22 (see FIGS. 2(B), 2(C), 2(D), and 2(F)). That is, the unmounting surface 42 has the same height level as the top surface 39 of the connector 21 when the connector 21 is mounted on the substrate 22.

The cut portion 43 is an open recess provided at an outer periphery edge portion 22a of the substrate 22 and has such a size as to receive the connector 21. Further, the cut portion 43 is formed by removing almost half the outer periphery edge portion 22a from the substrate 22. The cut portion 43 has a first edge portion 44a, a second edge portion 44b, and a third edge portion 44c. The first edge portion 44a and the second edge portion 44b are parallel to each other. Further, the first edge portion 44a includes a projection 45a. The projection 45a has such a shape as to engage with the stepped portion 35b of the connector 21. The second edge portion 44b includes a projection 45b. The projection 45b has such a shape as to engage with the stepped portion 35c of the connecter 21. The third edge portion 44c, provided between the first edge portion 44a and the second edge portion 44b, is retreated from the outer periphery edge portion 22a of the substrate 22. Further, the third edge portion 44c has the conductive pattern (not shown) along almost the entire length of the third edge portion 44c.

The indentations 46 are provided at a portion at which the first edge portion 44a meets the third edge portion 44c, and at a portion on which the second edge portion 44b meets the third edge portion 44c. The indentations 46 are positioned so as to engage with the supporting portions 36 of the connector 21. Further, the indentations 46 each has such a shape as to engage with each of the supporting portions 36 of the connector 21.

Figure 3B:
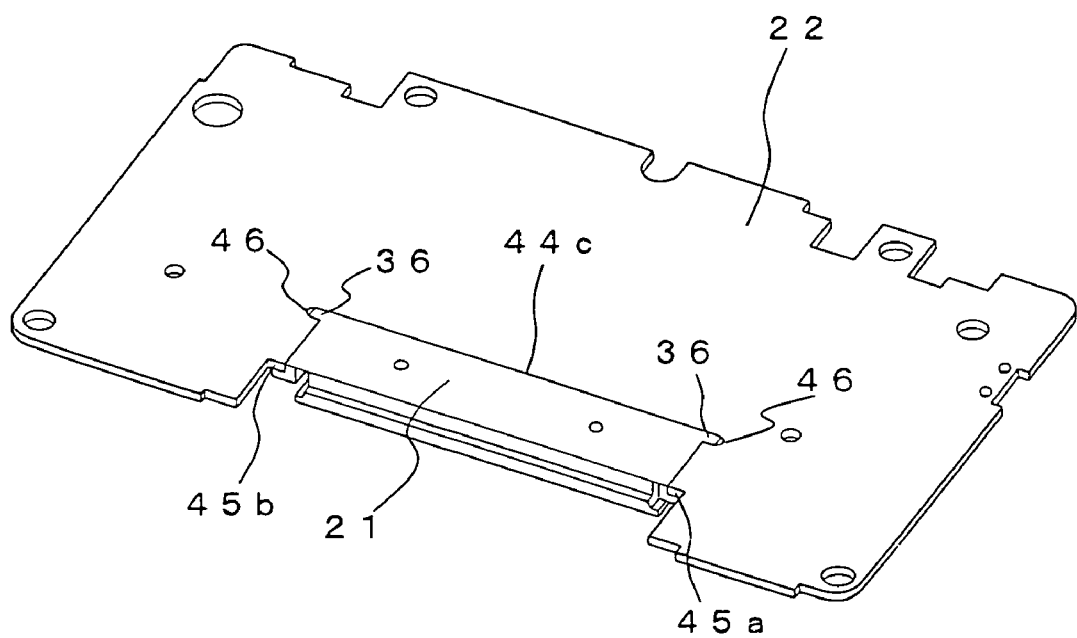

When the aforementioned connector 21 is mounted on the substrate 22, the stepped portion 35a engages with the third edge portion 44c and the indentations 46 engage with the supporting portions 36. At the same time, the stepped portions 35b and 35c engage with the projections 45a and 45b, respectively, as shown in FIG. 3(B). Consequently, the protrusion portion 32 and the plurality of pin terminals 33 engage with the mounting surface 41 of the substrate 22 so as to contact the conductive pattern of the third edge portion 44c, so that the protrusion portion 32 and the plurality of pin terminals 33 electrically connect with the mounting surface 41 of the substrate 22. That is, the protrusion portion 32 and the plurality of pin terminals 33 are caught on the mounting surface 41 of the substrate 22. Further, the stepped portions 35a, 35b, and 35c each includes a height difference corresponding to the thickness of the substrate 22, and therefore the top surfaces 39 of the connector 21 is flush with the unmounting surface 42 of the substrate 22 when the connector 21 is mounted on the substrate 22.

As described above, according to the present embodiment of the present invention, a thickness of the electronic circuit module can be reduced as compared to a case where the connector 21 is surface-mounted on the substrate 22 in a conventional manner. The use of the aforementioned electronic circuit module can realize a reduction in thickness of an electronic device such as the hand-held game apparatus. Further, the stepped portion 35a is provided, and therefore when the game cartridge 17 is inserted into the connector 21, the substrate 22 supports the connector 21. As a result, a support strength for the connector 21 is increased when the game cartridge 17 is inserted therein. Since the stepped portions 35b and 35c are provided on both sides of the connector 21 along the short sides thereof such that the connector 21 engages with the substrate 22, thereby stabilizing the connector 21. Therefore, the stepped portions 35a, 35b, and 35c act on each other, thereby securing the connector 21 to the substrate 22. Consequently, the connector 21 acts as a reinforcing component for the substrate 22 so as to prevent the substrate 22 from, for example, being warped. That is, a thickness of the electronic circuit module can be reduced, and a strength of the substrate, that is, a strength of the electronic circuit module, can be simultaneously increased. Particularly, the thinner the substrate 22 is, the larger this effect is. Further, the reinforcing portions 38 are provided, and therefore the engagement of the connector 21 with the substrate 22 enhances the stability of the connector 21, thereby preventing the connector 21 from being misaligned. Moreover, the protrusion portion 32 is caught on the mounting surface 41, and therefore it is possible to prevent the connector 21 from being moved up and down. For example, according to the present embodiment, it is possible to prevent the connector 21 from being moved in the direction of the unmounting surface 42 of the substrate 22. As a result, the stability of the connector 21 can be enhanced.

Further, the connector 21 includes the supporting portions 36, and the cut portion 43 includes the indentations 46. Therefore, when the game cartridge 17 is dismounted from the connector 21, the supporting portions 36 are caught on the indentations 46, thereby preventing the connector 21 from being pulled by the game cartridge 17 and being removed from the substrate 22.

The unmounting surface 42 of the substrate 22 is flush with the top surface 39 of the connector 21 when the connector 21 is mounted on the substrate 22, and therefore a space on the unmounting surface 42 in the housing 18 for accommodating the electronic circuit module can be used with enhanced effectiveness or can be removed. Accordingly, the circuit components and the like to be accommodated in the lower housing 18b can be increased and the thickness of the lower housing 18b can be substantially reduced, which leads to a substantial reduction in thickness of an electronic device such as the hand-held game apparatus 1.

Moreover, when the electronic circuit module is accommodated in the lower housing 18b with the top surface 39 of the connector 21 and the unmounting surface 42 of the substrate 22, which are flush with each other, oriented upward so as to press, against the lower housing 18b, the top surface 39 of the connector 21 and the unmounting surface 42 of the substrate 22, it is possible to prevent the substrate from, for example, being warped, thereby increasing the strength of the electronic circuit module.

Further, when the connector 21 is surface-mounted on the substrate 22, the connector 21 engages with the substrate 22 so as to prevent the connector 21 from going beyond the unmounting surface 42 of the substrate 22, thereby facilitating the surface-mounting process.

The direction switch 14c and the like may lie to the right and the left of the connector 21. For example, as shown in FIG. 1, the direction switch 14c may lie to the left of the connector 21 and the operation switches 14a and 14b may lie to the right of the connector 21. Thus, a user is allowed to apply forces to the right and the left of the substrate 22, thereby preventing the substrate 22 from being warped.

While the present invention has been described in detail, the foregoing description is in all aspects illustrative and not restrictive. It is understood that numerous other modifications and variations can be devised without departing form the scope of the invention.

What is claimed is:

1. An electronic circuit module comprising a substrate and a connector which is at least surface-mounted on the substrate, comprising the substrate including
a first recessed portion shaped so as to be open toward an outer periphery of the substrate, and
a conductive pattern on an edge potion of the first recessed potion, and the connector including a body including a protrusion portion, wherein the plane of at least the largest surface of one reinforcing portion extends in a direction perpendicular to the substrate from one surface of the protrusion portion, and terminals which are surface-mounted on the substrate and protrude from the body, the connector being mounted on the substrate such that a bottom of the terminals is positioned higher than a bottom of the body by a predetermined height, and the connector being mounted on the substrate such that the body is disposed in the first recessed portion and the terminals contact the conductive pattern on the substrate, wherein the first recessed portion includes second recessed portions so as to prevent the connector engaging with the first recessed portion from moving sideways, and the connector includes projections shaped so as to correspond to the second recessed portions, and the projections are disposed at positions corresponding to the second recessed portions when the connector is mounted on the substrate.

2. The electronic circuit module according to claim 1, wherein the connector is mounted on the substrate such that a stepped portion provided between the bottom of the body and the bottom of the terminals engages with a side surface of the substrate at the first recessed portion.

3. The electronic circuit module according to claim 1, wherein
the connector is mounted on the substrate such that a bottom of the protrusion portion is positioned higher than the bottom of the body by the predetermined height, and
the connector is mounted on the substrate such that the protrusion portion engages with the substrate.

4. The electronic circuit module according to claim 3, wherein
the protrusion portion protrudes from the body and has the terminals mounted thereon, and
the terminals protrude from the protrusion portion.

5. The electronic circuit module according to claim 4, wherein
an outer periphery of the first recessed portion of the substrate is defined by three sides,
the conductive pattern is provided near an edge portion of a center side among the three sides, and
the protrusion portion engages with the substrate at a position near the center side when the connector is mounted on the substrate.

6. The electronic circuit module according to claim 4, wherein the reinforcing portions extend from both sides of the protrusion portion.

7. The electronic circuit module according to claim 1, wherein the reinforcing portions are disposed to a right and a left of the terminals.

8. The electronic circuit module according to claim 5, wherein
the body further includes auxiliary protrusion portions, and
the connector is mounted on the substrate such that the auxiliary protrusion portions engage with the substrate near a right side and a left side among the three sides, respectively, and bottoms of the auxiliary protrusion portions are positioned higher than the bottom of the body by the predetermined height.

9. The electronic circuit module according to claim 1, wherein
an outer periphery of the first recessed portion of the substrate is defined by three sides, and a center side among the three sides is longer than a right side and a left side among the three sides,
the conductive pattern is provided near an edge portion of the center side along almost an entire length of the center side,
a surface, of the body, corresponding to the center side contacts the center side when the connector is mounted on the substrate, and the surface has a longitudinal length which is substantially equal to an entire length of the center side, and
the terminals are provided at a position which corresponds to the conductive pattern when the connector is mounted on the substrate.

10. The electronic circuit module according to claim 1, wherein
the first recessed portion is formed by removing at least almost a half of one side of the substrate so as to receive the connector, and
the first recessed portion engages with the connector so as to mount the connector on the substrate.

11. The electronic circuit module according to claim 1, wherein
an outer periphery of the first recessed portion of the substrate is defined by three sides, and
the second recessed portions are formed on a right side and a left side among the three sides.

12. The electronic circuit module according to claim 1, wherein switch components for allowing a user to operate the electronic circuit module are disposed to a right and a left of the connector mounted on the substrate.

13. The electronic circuit module according to claim 1, wherein the connector is a connector into which a cartridge for a game apparatus is insertable.

14. The electronic circuit module according to claim 1, wherein the predetermined height is determined such that a bottom of the substrate is flush with the bottom of the body when the connector is mounted on the substrate.

15. The electronic circuit module according to claim 6, wherein the planes of the reinforcing portions also extends from the body in a direction parallel to the substrate.

16. A connecter which is surface-mounted on a predetermined substrate, comprising
a body including a protrusion portion, wherein the plane of at least the largest surface of one reinforcing portion extends in a direction perpendicular to the substrate from one surface of the protrusion portion, and
terminals which are surface-mounted on the predetermined substrate and protrude from the body,
the connector being mounted on the predetermined substrate such that a bottom of the terminals is positioned higher than a bottom of the body by a predetermined height, and
the connector being mounted on the predetermined substrate such that the body is disposed in a recessed portion of the predetermined substrate and the terminals contact a conductive pattern on the predetermined substrate, wherein the predetermined height is determined such that a bottom of the substrate is flush with the bottom of the body when the connector is mounted on the substrate.

17. The electronic circuit module according to claim 16, wherein
the protrusion portion protrudes from the body and has the terminals mounted thereon,
the terminals protrude from the protrusion portion, and
the reinforcing portions extend from both sides of the protrusion portion.

18. The electronic circuit module according to claim 17, wherein the planes of the reinforcing portions also extend from the body in a direction parallel to the substrate.

19. A hand-held video game apparatus comprising:
an LCD display to display a game being played;
one or more control buttons to control a game object in the game being played;
an electronic circuit module comprising a substrate and a video game cartridge connector which is at least surface-mounted on the substrate, comprising:
the substrate including:
  a first recessed portion shaped so as to be open toward an outer periphery of the substrate, and
  a conductive pattern on an edge potion of the first recessed potion, and
the connector including:
  a body including reinforcing portions extending from both sides of a protrusion portion in a direction in which the terminals protrude from the protrusion portion, and
  terminals which are surface-mounted on the substrate and protrude from the body,
wherein the connector being mounted on the substrate such that a bottom of the terminals is positioned higher than a bottom of the body by a predetermined height, and
the connector being mounted on the substrate such that the body is disposed in the first recessed portion and the terminals contact the conductive pattern on the substrate.

* * * * *